(12) United States Patent
Kwon et al.

(10) Patent No.: US 10,515,920 B2
(45) Date of Patent: Dec. 24, 2019

(54) HIGH BANDWIDTH MEMORY PACKAGE FOR HIGH PERFORMANCE PROCESSORS

(71) Applicant: Google LLC, Mountain View, CA (US)

(72) Inventors: Woon Seong Kwon, Cupertino, CA (US); Nam Hoon Kim, Mountain View, CA (US); Teckgyu Kang, Saratoga, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/948,456

(22) Filed: Apr. 9, 2018

(65) Prior Publication Data

US 2019/0312002 A1    Oct. 10, 2019

(51) Int. Cl.
*H01L 23/02* (2006.01)
*H01L 23/00* (2006.01)
*H01L 25/18* (2006.01)
*H01L 25/00* (2006.01)

(52) U.S. Cl.
CPC ............. *H01L 24/17* (2013.01); *H01L 24/83* (2013.01); *H01L 25/18* (2013.01); *H01L 25/50* (2013.01); *H01L 2224/05548* (2013.01); *H01L 2224/05569* (2013.01); *H01L 2924/1433* (2013.01); *H01L 2924/1434* (2013.01)

(58) Field of Classification Search
CPC ..... G06F 17/5063; H01L 24/83; H01L 24/17; H01L 5/50; H01L 25/18
USPC ........................................................ 257/678
See application file for complete search history.

(56) References Cited

U.S. PATENT DOCUMENTS

| | | | |
|---|---|---|---|
| 9,087,765 B2 | 7/2015 | Chun et al. | |
| 9,432,298 B1* | 8/2016 | Smith | ................. H04L 49/9057 |
| 9,922,845 B1 | 3/2018 | Shih | |
| 2010/0225002 A1* | 9/2010 | Law | ................. H01L 21/76898 |
| | | | 257/774 |

(Continued)

OTHER PUBLICATIONS

Deo, Manish. Intel White Paper: "Enabling Next-Generation Platforms Using Intel's 3D System-in-Package Technology" 7 pages, retrieved on Apr. 9, 2018 from URL: https://www.altera.com/content/dam/altera-www/global/en_US/pdfs/literature/wp/wp-01251-enabling-nextgen-with-3d-system-in-package.pdf.

(Continued)

*Primary Examiner* — Caleb E Henry
(74) *Attorney, Agent, or Firm* — Lerner, David, Littenberg, Krumholz & Mentlik, LLP

(57) ABSTRACT

Integrated component packages and methods of assembling integrated component packages are provided. The integrated component package can comprise a bump pitch relaxing layer. A high-bandwidth memory component directly mechanically coupled to the bump pitch relaxing layer on a first side of the bump pitch relaxing layer via a first set of bump bond connections. The high-bandwidth memory component directly electrically coupled to the bump pitch relaxing layer on the first side of the bump pitch relaxing layer via the first set of bump bond connections. The bump pitch relaxing layer mechanically coupled to a first side of a substrate via second set of bump bond connections. The high-bandwidth memory component electrically coupled to the substrate via the bump-pitch relaxing layer and the second set of bump bond connections, and a bump pitch of the second set of bump bond connections is larger than the first set of bump bond connections.

10 Claims, 6 Drawing Sheets

(56) References Cited

U.S. PATENT DOCUMENTS

| | | |
|---|---|---|
| 2011/0042795 A1 | 2/2011 | Knickerbocker |
| 2013/0093097 A1* | 4/2013 | Yu .................. H01L 21/568 257/774 |
| 2015/0117091 A1* | 4/2015 | Maheshwari ......... G11C 11/413 365/154 |
| 2015/0117092 A1* | 4/2015 | Maheshwari ........ G11C 7/1075 365/154 |
| 2017/0025601 A1* | 1/2017 | Bhushan ................ H01L 43/08 |

OTHER PUBLICATIONS

International Search Report and Written Opinion dated Jul. 9, 2019 in PCT Application No. PCT/US2019/024553.

* cited by examiner

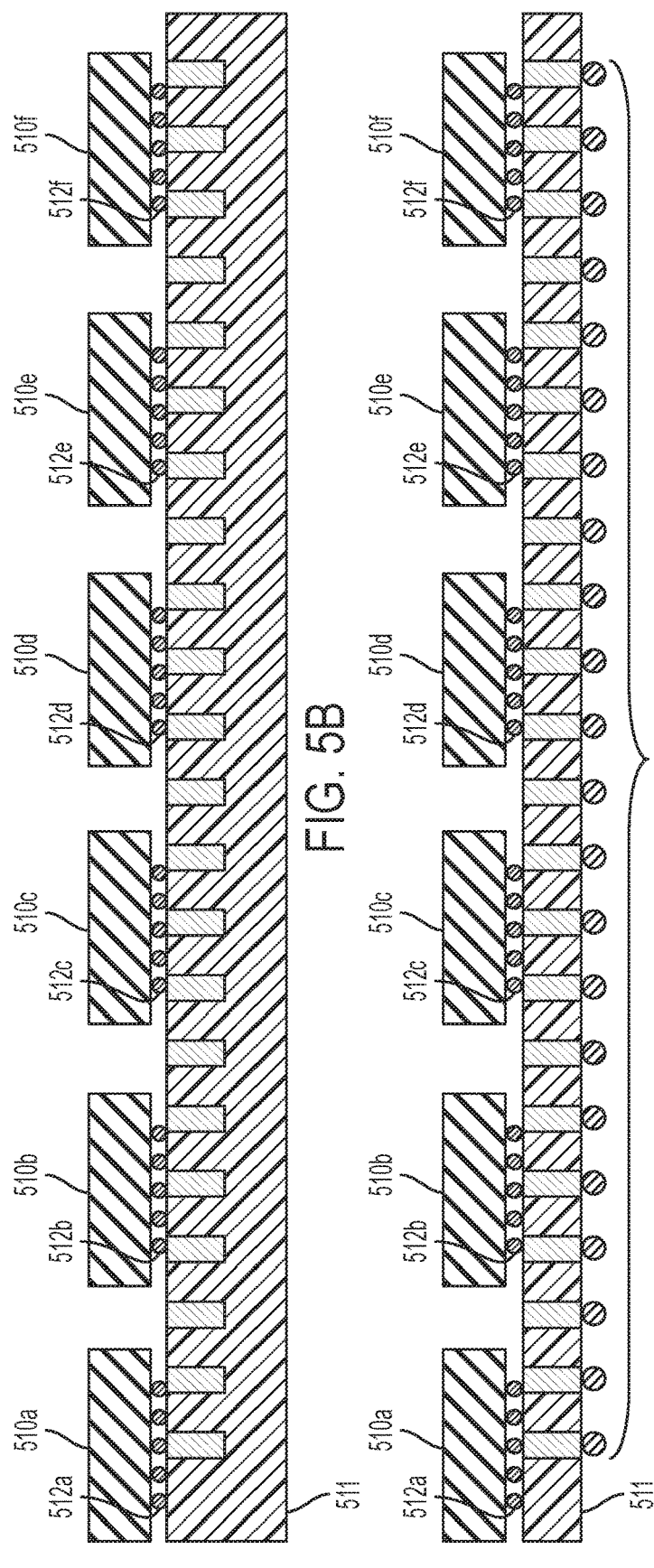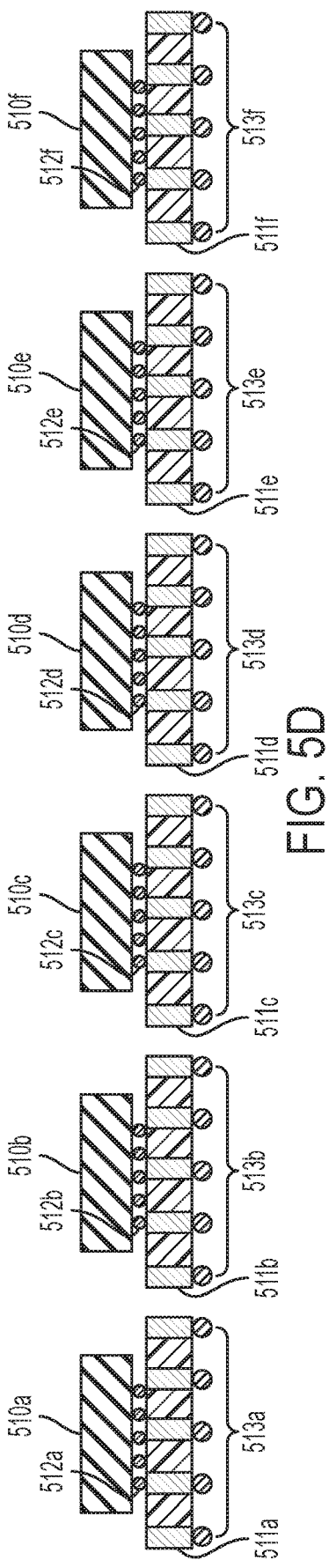
FIG. 5B
FIG. 5C
FIG. 5D

HIGH BANDWIDTH MEMORY PACKAGE FOR HIGH PERFORMANCE PROCESSORS

BACKGROUND

The growth in the amount of data and increase in the usage of high performance ASICs and other processors in data centers require systems and integrated component packages with large high bandwidth memory capacity. Typically high bandwidth memory capacity in systems and/or integrated component packages is increased by stacking memory layers on top of each other or by increasing the unit capacity of each high-bandwidth memory component. However, stacking memory layers on top of each other or increasing unit capacity of each high-bandwidth memory component increases manufacturing cost and increases fabrication complexity.

SUMMARY

According to one aspect, the subject matter described in this disclosure relates to an integrated component package that includes a bump pitch relaxing layer. A high-bandwidth memory component is directly mechanically coupled to the bump pitch relaxing layer on a first side of the bump pitch relaxing layer via a first set of bump bond connections. The high-bandwidth memory component is directly electrically coupled to the bump pitch relaxing layer on the first side of the bump pitch relaxing layer via the first set of bump bond connections. The bump pitch relaxing layer is mechanically coupled to a first side of a substrate via a second set of bump bond connections. The high-bandwidth memory component is electrically coupled to the substrate via the bump-pitch relaxing layer and the second set of bump bond connections, wherein a bump pitch of the bump bond connections in the second set of bump bond connections is larger than a bump pitch of the bump bond connections in the first set of bump bond connections.

In some implementations, the first set of bump bond connections are packed more densely than the second set of bump bond connections. In some implementations, a redistribution layer is included in the bump pitch relaxing layer and a dielectric layer is included on top of the redistribution layer. In some implementations, the bump pitch relaxing layer includes plated thru-holes that correspond to the second set of bump bond connections. In some implementations the redistribution layer includes one or more traces that terminate at one end of the plated thru-holes and the other end are exposed to openings that correspond to the first set of bump bond connections.

In some implementations, a processor is coupled to the substrate via a third set of bump bond connections. In some implementations, a bump pitch of the third set of bump bond connections is larger than a bump pitch of the first set of bump bond connections. In some implementations one or more high-speed input/output (I/O) traces are coupled to the bump pitch relaxing layer and the third set of bump bond connections. In some implementations, the high-bandwidth memory component is electrically coupled to the processor via the bump pitch relaxing layer.

In some implementations, the integrated component package includes a decoupling on-package capacitor connected to a top side of the substrate. In some implementations, the processor is an application specific integrated circuit. In some implementations, the substrate is an organic substrate. In some implementations, the bump pitch relaxing layer comprises silicon.

At least one aspect is directed to a method of assembling an integrated component package. The method includes directly mechanically coupling a high-bandwidth memory component to bump pitch relaxing layer via a first set of bump bond connections. The method includes directly electrically coupling the high-bandwidth memory component to the bump pitch relaxing layer via the first set of bump bond connections. The method includes directly mechanically coupling the bump pitch relaxing layer to a first side of a substrate. The method includes electrically coupling the high-bandwidth memory component to the substrate via the bump pitch relaxing layer and the second set of bump bond connects. A bump pitch of the bump bond connections in the second set of bump bond connections is larger than a bump pitch of the bump bond connections in the first set of bump bond connections.

BRIEF DESCRIPTION OF THE DRAWINGS

The foregoing will be apparent from the following more particular description of example implementations of the invention, as illustrated in the accompanying drawings. The drawings are not necessarily to scale, emphasis instead being placed upon illustrating implementations of the present invention.

FIG. 5B is a cross-sectional view of high-bandwidth memory components coupled to a bump pitch relaxing layer wafer according to an example implementation.

FIG. 5C is a cross-sectional view of high-bandwidth memory component coupled to a bump pitch relaxing layer wafer that is thinned according to an example implementation.

FIG. 5D is a cross-section view of high-bandwidth memory component coupled to bump pitch layers that are singulated according to an example implementation.

For purposes of clarity, not every component may be labeled in every figure. The drawings are not intended to be drawn to scale. Like reference numbers and designations in the various figures indicate like elements.

DETAILED DESCRIPTION

Figure 1:
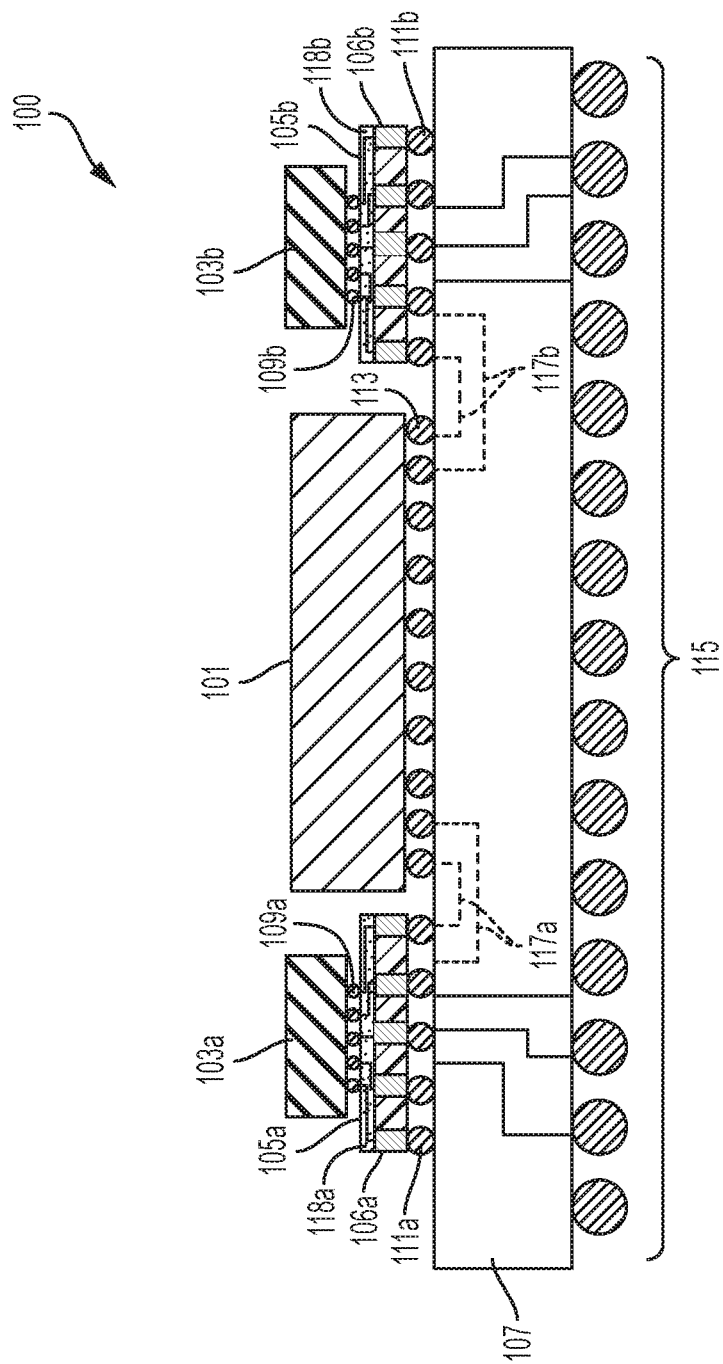
FIG. 1 is a diagram of a cross-sectional view of an integrated component package according to an example implementation.

This disclosure generally relates to integrated component packages and methods of assembling integrated component packages that increase high bandwidth memory capacity in an integrated component package. However increasing high bandwidth memory capacity by stacking the memory layers on top of each other or by increasing the unit capacity of each high-bandwidth memory component results in increases in manufacturing costs and fabrication complexity.

The challenges of increasing high bandwidth memory capacity can be overcome by coupling a high bandwidth memory component coupled to a bump pitch relaxing layer. The bump pitch relaxing layer is coupled to bump bond connections, which have a bump pitch that is larger than the bump bonds of the high bandwidth memory components. As used herein, the term "bump pitch" refers to the distance between one bump bond of a component and an adjacent bump bond of that component, for example, the distance between the center of one bump bond of the bump pitch relaxing layer and the center of immediately adjacent bump bond of the bump pitch relaxing layer. The bump pitch of a first set of bump bond connections is considered to be larger than the bump pitch of a second set of bump bond connections if the distance between the bump bonds in the first set is greater than the distance between the second set of bump bonds. A larger bump pitch is referred to herein as being more relaxed and a smaller bump pitch is referred to herein as being less relaxed. Typically, a bump pitch remains constant, bump to bump, between any two components connected by a set of bumps. The bump pitch relaxing layer is coupled to a substrate of an integrated component package. The integrated component package includes a processor and the processor and a high bandwidth memory component are electrically coupled via the bump bond connections of the bump pitch relaxing layer and the bump bond connections of the high bandwidth memory component. Coupling the high bandwidth memory components to the bump pitch relaxing layers allows for avoiding using of a single large interposer to which the various processor and high bandwidth memory components are coupled.

However, using bump pitch relaxing layers, as described herein, allows for various configurations of high bandwidth memory components on the substrate without increasing manufacturing costs and fabrication complexity. Additionally, use of the bump pitch relaxing layers reduces size constraints of other components of the integrated component package, such as die size of a processor. The reduction of size constraints on the integrated component package allows for easy addition of components to the integrated component package, such as on-package decoupling capacitors, which can be configured to deliver power to the processor and the high bandwidth memory components. The increase in the efficiency of power delivery to the high bandwidth memory components also allows for increases performance of high bandwidth memory components. Accordingly, high bandwidth memory capacity is increased in an integrated component package without substantially increasing manufacturing costs and fabrication complexity.

FIG. 1 is a cross-sectional view of an integrated component package 100 according to an example implementation. The integrated component package 100 includes one or more High Bandwidth Memory (HBM) components, such HBMs 103a and 103b, generally referred to as HBMs 103, one or more HBM bump pitch relaxing layer, referred to herein as "bump pitch relaxing layer," such as bump pitch relaxing layer 105a or 105b (generally referred to as bump pitch relaxing layer 105), a substrate 107, and a processor 101. Examples of the processor 101 include, but are not limited to, an application specific integrated circuit (ASIC) and other special purpose processors. The HBMs 103 are coupled to the bump pitch relaxing layers 105. For example, as shown in FIG. 1, the HBM 103a is coupled to the bump pitch relaxing layer 105a and the HBM 103b is coupled to the bump pitch relaxing layer 105b.

The HBM 103 and the bump pitch relaxing layer 105 are coupled to each other via an electrical interface, such as an electrical interface provided by bump bonds, such as bump bonds 109a and 109b (generally referred to as bump bonds 109). For example, one side of the HBM 103a is electrically connected to a first side of the bump pitch relaxing layer 105a with bump bonds 109a. Similarly, one side of the HBM 103b is electrically connected to a first side of the bump pitch relaxing layer 105b with bump bonds 109b. The HBM 103a is mechanically coupled to the bump pitch relaxing layer 105a and the HBM 103b is mechanically coupled to the bump pitch relaxing layer 105b. In some implementations, the bottom side of the HBM 103a is mechanically directly coupled to a top side of the bump pitch relaxing layer 105a via the bump bonds 109a on the bottom side of the HBM 103a, and the bottom side of HBM 103b is mechanically directly coupled to a top side of the bump pitch relaxing layer 105b via the bump bonds 109b on the bottom side of the HBM 103b. In some implementations the diameter of each of the bump bonds 109 is around 55 micrometers.

The bump pitch relaxing layers 105a and 105b are coupled to the substrate via an electrical interface, such as an electrical interface provided by bump bonds 111a and 111b (generally referred to as bump bonds 111). In some implementations, the bump bonds 111 are coupled to the bottom side of the bump pitch relaxing layers 105a and 105b. The bump pitch of the bump bonds 111 is larger than the bump pitch of the bump bonds 109. In some implementations, the diameter of each of the bump bonds 111 is greater than the diameter of each of the bump bonds 109. In some implementations, the diameter of each of the bump bonds 111 is between 70 micrometers to 100 micrometers. For example, the bump bonds 111 can be of a diameter 80 micrometers. A second side of each of the bump pitch relaxing layers 105 is electrically connected to substrate 107 with bump bonds 111. For example, the bottom side of the bump pitch relaxing layer 105a is electrically connected to the substrate 107 by the bump bonds 111a. Similarly, the bottom side of the bump pitch relaxing layer 105b is electrically connected to the substrate 107 by the bump bonds 111b. In some implementations, the bump pitch relaxing layers 105 can include a metal-insulator-metal (MIM) capacitor and the MIM capacitors in the bump pitch relaxing layers 105 can be configured to improve power delivery to the HBMs 103.

The bottom of the bump pitch relaxing layer 105a is mechanically coupled to the top of the substrate 107, and the bottom of the bump pitch relaxing layer 105b is mechanically coupled to the top of the substrate 107. The bump pitch relaxing layers 105 may include layers of conductors and dielectrics. The bump pitch relaxing layers 105 may include one or more connection structures, such as connection structure 106a of the bump pitch relaxing layer 105a, and connection structure 106b of the bump pitch relaxing layer 105b, generally referred to herein as connection structures 106. Examples of connection structures 106 include, but are not limited to, plated thru-holes, vias, through-silicon vias (TSVs), microvias, and the like, including any combination thereof. In some implementations, the connection structures 106 type may depend upon the materials used in the bump pitch relaxing layer 105. For example, if the bump pitch relaxing layer 105 comprises silicon, then connection structures 106 may be through-silicon vias (TSVs).

The bump pitch relaxing layers 105 can include dielectric layers, redistribution layers, and bump pads to accommodate transition from a more dense packing of bump bonds at one surface of the bump pitch relaxing layer to sparser packing of bump bonds at another surface of the bump pitch relaxing layers 105. For example, the bump pitch relaxing layers 105 can include a redistribution layer on top of the plated thru-holes 106 that correspond to the sparser packed bump bonds 111 at the bottom surface of the bump pitch relaxing layers 105, such as redistribution layer 118*a* in the bump pitch relaxing layer 105*a*, and redistribution layer 118*b* in the bump pitch relaxing layer 105*b*, generally referred to herein as redistribution layer 118. A dielectric layer can be provided on top of the redistribution layer 118. The redistribution layer 118 includes traces that terminate, at one end, at the plate thru-holes 106, and at the other end, the traces are exposed through the upper dielectric layer with openings that correspond to the densely packed bump bonds 109 of the HBMs 103 that are coupled to the bump pitch relaxing layers 105 at the top surface of the bump pitch relaxing layers 105. Such openings, in some implementations are covered with metal, e.g., copper, silver, gold, or other highly conductive metal or metal alloy, bump pads, to which the bumps electrically connect.

Therefore, by attaching the HBMs 103 to bump pitch relaxing layers 105, the HBMs 103 are electrically coupled to the substrate 107, the processor 101, and other components of the integrated component package 100 via the bump bonds 111 and the bump pitch of the HBMs 103 is increased from the bump pitch of the bump bonds 109 to the bump pitch of the bump bonds 111. By using such bump pitch relaxing layers as the bump pitch relaxing layers 105, the integrated component package 100 can avoid utilizing a single large interposer. This relaxing of the bump pitch of the HBM 103 removes the constraint of the bump pitch placed on other components of the integrated component package 100. For example, as described below, the bump pitch of the processor 101 can be different from the bump pitch of the HBMs 103. Using the bump pitch relaxing layer 105, the HBM 103 can be assembled on to the substrate 107 without assembling or attaching the HBM 103 onto a traditional interposer and attaching that traditional interposer onto the substrate 107.

The processor 101 is coupled to the substrate 107 via an electrical interface, such as an electrical interface provided by bump bonds 113. The bump bonds 113 are coupled to the bottom side of the processor 101 and the bottom side of the processor 101 is coupled to the top side of the substrate 107. The diameter of each of the bump bonds 113 is independent and different from the diameter of each of the bump bonds 109. In some implementations, the bump pitch of the bump bonds 113 is different from the bump pitch of the bump bonds 109 and/or the bump bonds 111. For example, the bump pitch of the bump bonds 113 is larger than the bump pitch of the bump bonds 109 or the bump pitch of the bump bonds 111. In some implementations, the diameter of each of the bump bonds 113 is greater than the diameter of each of the bump bonds 109. In some implementations, the diameter of each of the bump bonds 113 is greater than 55 micrometers. In some implementations, the diameter of each of the bump bonds 113 can be the same as the diameter of the bump bonds 111. In some implementations, the processor 101 is connected to the substrate 107 using a controlled collapse chip connection (C4) and the diameter of each of the bump bonds 113 can be a standard diameter of a C4 connection. The bump pitch relaxing layers 105 is electrically connected to the processor 101 via one or more electrical connections, such as traces 117*a* and 117*b*. For example, the bump pitch relaxing layer 105*a* is electrically connected to the processor 101 via trace 117*a* and the bump pitch relaxing layer 105*b* is electrically connected to the processor 101 via trace 117*b*. Traces 117*a* and 117*b* can be traces within the substrate 107. The line width and spacing of traces 117*a* and 117*b* can be 3 to 6 micrometers. For example, the line width and the spacing of traces 117*a* and 117*b* can be 5 micrometers. The traces 117*a* and 117*b* can be formed from a metal or a metal alloy, such as gold, silver, titanium, tungsten, copper, and the like. The metals used to from the traces 117*a* and 117*b* have low electrical resistance.

Figure 3:
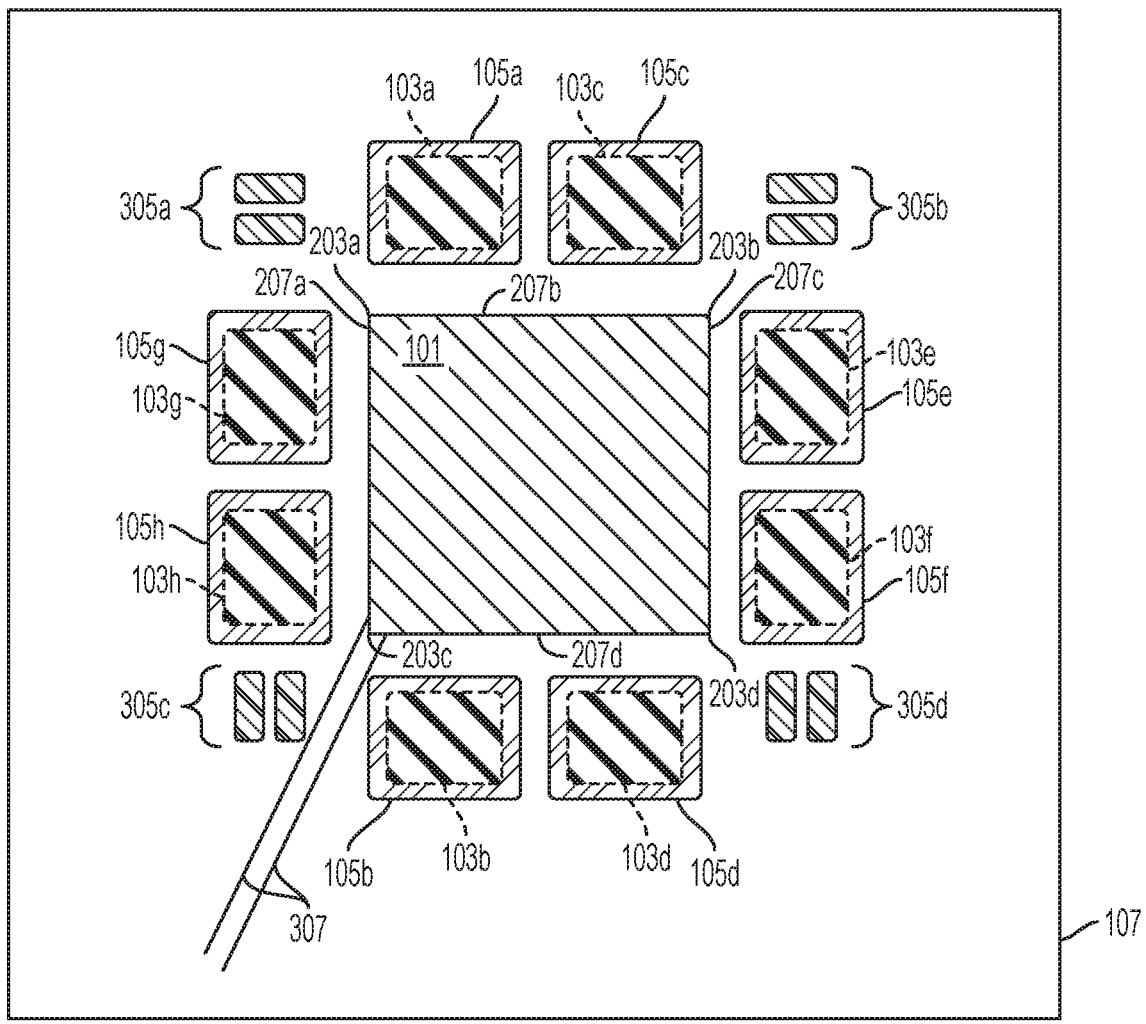
FIG. 3 is a diagram of a top view of an example arrangement of an integrated component package according to an example implementation.
Figure 4:
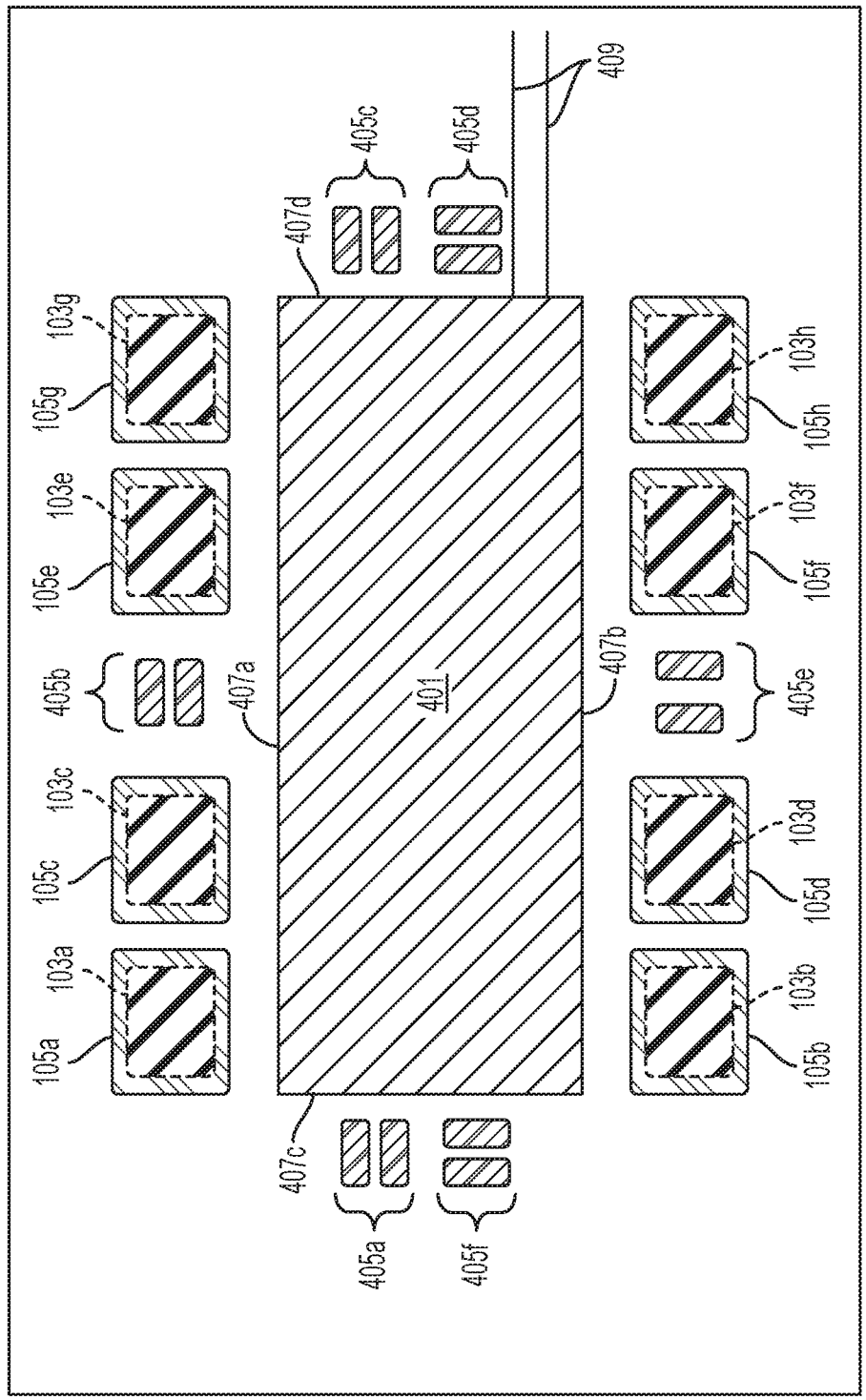
FIG. 4 is a diagram of a top view of an example arrangement of an integrated component package according to an example implementation.

The HBMs 103 are electrically connected to the processor 101 and data can be transmitted between the HBM 103 and the processor 101. For example, the HBMs 103 are electrically connected to the processor 101 via bump bonds 109, the thru-silicon vias 106 of the bump pitch relaxing layers 105, bump bonds 111, and the traces 117. The width of traces 117 can be between 3 to 6 micrometers, and the width and thickness of the traces of 117 between the processor 101 and the HBMs 105 can allow for transfer of data at speeds greater than 2.4 gigabits per second. Using the bump pitch relaxing layers 105, as described herein, allows for various configurations of locating the HBM on the substrate 107. Some examples of these arrangements are shown in FIGS. 2, 3, and 4.

Figure 2:
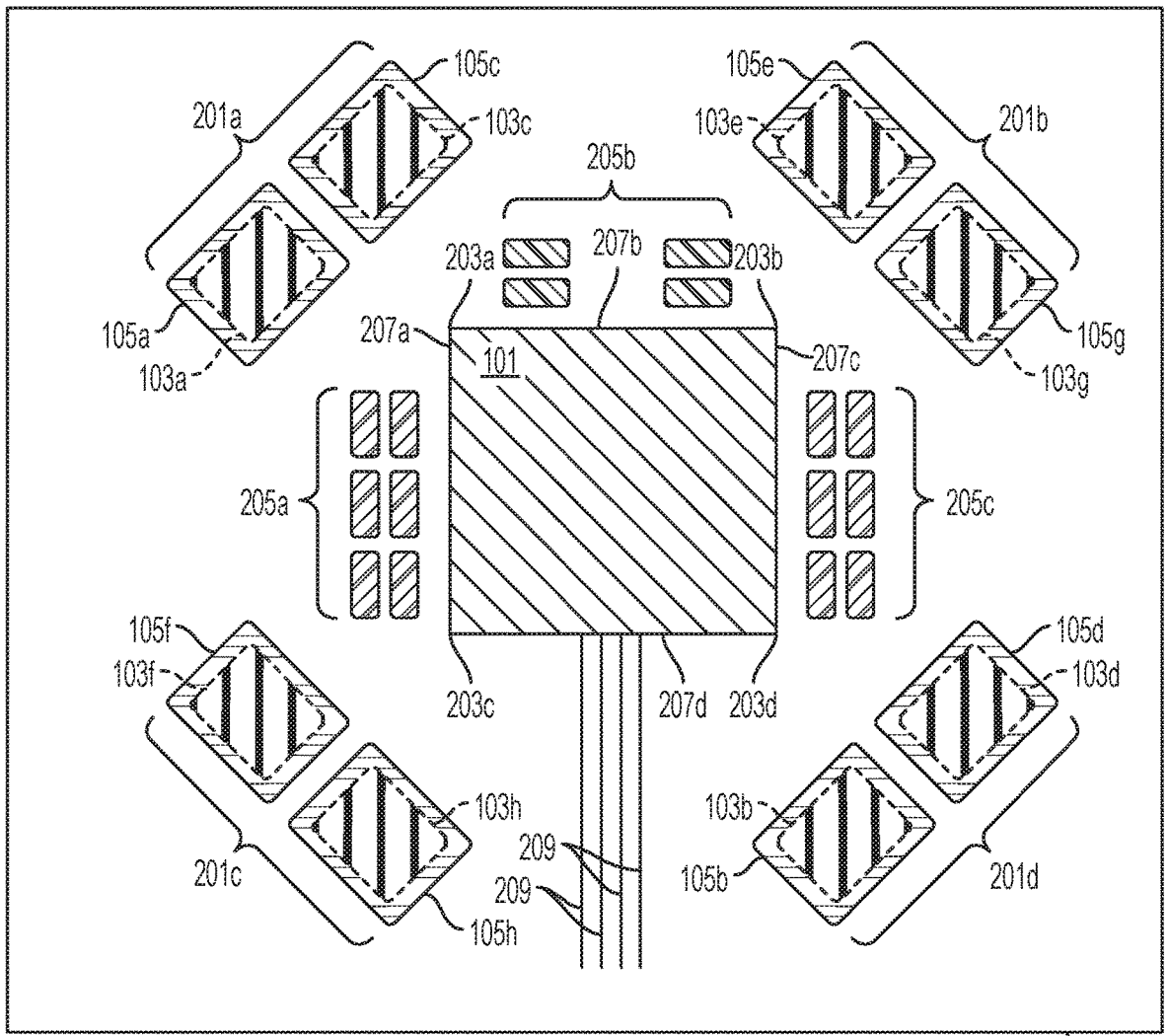
FIG. 2 is a diagram of a top view of an example arrangement of an integrated component package according to an example implementation.

FIG. 2 is a top down view of an example 200 of an integrated component package shown in FIG. 1. For the purpose of illustrating a clear example, components shown and described with reference to FIG. 1 will be used to describe the arrangement of components shown in FIG. 2. In FIG. 2, the integrated component package 200 includes multiple HBMs 103 coupled to their respective bump pitch relaxing layers 105, such as HBM 103*a* coupled to bump pitch relaxing layer 105*a*, HBM 103*b* coupled to bump pitch relaxing layer 105*b*, HBM 103*c* coupled to bump pitch relaxing layer 105*c*, HBM 103*d* coupled to bump pitch relaxing layer 105*d*, HBM 103*e* coupled to bump pitch relaxing layer 105*e*, HBM 103*f* coupled to bump pitch relaxing layer 105*f*, HBM 103*g* coupled to bump pitch relaxing layer 105*g*, HBM 103*h* coupled to bump pitch relaxing layer 105*h*. The integrated component package 200 includes decoupling capacitors 205*a*, 205*b*, and 205*c*, and high speed input/output (I/O) traces 209. In this arrangement, two HBMs 103, coupled to their respective bump pitch relaxing layers 105, may be located adjacent to each other, such as HBM pair 201*a*, 201*b*, 201*c*, and 201*d*, generally referred to herein as HBM pairs 201. Each HBM pair 201 may be located at or near a corner of the processor 101. For example, as shown in FIG. 2, the HBM pair 201*a* is located at a corner 203*a*, the HBM pair 201*b* is located at a corner 203*b*, the HBM pair 201*c* is located at a corner 203*c*, and the HBM pair 201*d* is located at a corner 203*d*.

In some implementations, as shown in FIG. 2, the integrated component package 200 includes one or more on-package decoupling capacitors, such as decoupling capacitors 205*a*, 205*b*, and 205*c*. The decoupling capacitors 205*a*, 205*b*, and 205*c* can be located on the top side of the substrate 107. One or more of the decoupling capacitors 205*a*, 205*b*, and 205*c* can be configured to provide power to the processor 101 of the integrated component package 200. One or more of the decoupling capacitors 205*a*, 205*b*, and 205*c* can be configured to provide power to the HBMs 103.

In some implementations, as shown in FIG. 2, the decoupling capacitors 205*a*, 205*b*, and 205*c* can be positioned along sides of the processor 101. For example, decoupling capacitors 205*a* can be positioned along a side 207*a* of the processor 101, decoupling capacitors 205*b* can be positioned along a side 207*b* of the processor 101, decoupling capacitors 205*c* can be positioned along a side 207*c* of the processor 101. In some implementations, integrated component package 200 includes high speed I/O traces 209 to carry out high-speed I/O communications from and to the processor 101. The high speed I/O traces 209 can be formed from a metal or metal alloy, such as gold, silver, titanium, tungsten, copper, and the like. For example, the high speed I/O traces 209 can be formed from copper. In some implementations, the high speed I/O traces 209 can be an integral metal line. In some implementations, the high speed I/O traces 209 can be positioned such that a terminal end of each of the high speed I/O traces 209 is located by the side 207*d*. As described above, using the bump pitch relaxing layers 105 allows for flexibility in the positioning of the various components. Additional examples of positioning of the components are shown in FIG. 3 and FIG. 4, described below.

For the purpose of illustrating a clear example, components shown and described with reference to FIG. 1 will be used to describe the arrangement of components shown in FIG. 3. Turning now to FIG. 3, there is shown another example arrangement 300 of an integrated component package shown in FIG. 1. Integrated component package 300 includes the HBMs 103 coupled to their respective bump pitch relaxing layers 105, such as HBM 103*a* coupled to bump pitch relaxing layer 105*a*, HBM 103*b* coupled to bump pitch relaxing layer 105*b*, HBM 103*c* coupled to bump pitch relaxing layer 105*c*, HBM 103*d* coupled to bump pitch relaxing layer 105*d*, HBM 103*e* coupled to bump pitch relaxing layer 105*e*, HBM 103*f* coupled to bump pitch relaxing layer 105*f*, HBM 103*g* coupled to bump pitch relaxing layer 105*g*, HBM 103*h* coupled to bump pitch relaxing layer 105*h*. The integrated component package 300 includes decoupling capacitors 305*a*, 305*b*, 305*c*, and 305*d*, and high speed I/O traces 307. The HBMs 103 can be positioned along sides of the processor 101. For example, the HBM 103*a* coupled to the bump pitch relaxing layer 105*a* and the HBM 103*b* coupled to the bump pitch relaxing layer 105*b* are located along a side 207*b* of the processor 101, the HBM 103*e* coupled to the bump pitch relaxing layer 105*e* and the HBM 103*f* coupled to the bump pitch relaxing layer 105*f* are located along a side 207*c* of the processor 101. Similarly, the HBM 103*b* coupled to the bump pitch relaxing layer 105*b* and the HBM 103*d* coupled to the bump pitch relaxing layer 105*d* are located along a side 207*d* of the processor 101, and the HBM 103*g* coupled to the bump pitch relaxing layer 105*g* and the HBM 103*h* coupled to the bump pitch relaxing layer 105*h* are located along a side 207*a* of the processor 101.

The integrated component package 100 includes decoupling capacitors 305*a*, 305*b*, 305*c*, and 305*d*, generally referred to herein as decoupling capacitors 305. One or more of the decoupling capacitors 305 can be configured to provide power to the processor 101 and the HBMs 103. The decoupling capacitors 305 can be located on different locations on the integrated component package 300, such as at or near corners of the processor 101. For example, the decoupling capacitor 305*a* is located at a corner 203*a* of the processor 101, the decoupling capacitor 305*b* is located at a corner 203*b* of the processor 101, the decoupling capacitor 305*c* is located at a corner edge 203*c* of the processor 101, and the decoupling capacitor 305*d* is located at a corner edge 203*d* of the processor 101. The integrated component package 300 includes high speed traces 307, which similar to high speed traces 209, can be configured to carry out high-speed I/O communications from and to the processor 101 and can be formed from a metal or metal alloy, such as gold, silver, titanium, tungsten, copper, and the like. The metal used to form the high-speed I/O traces 307 can be copper. In some implementations, the high-speed I/O traces 307 can be an integral metal line. The high speed traces 307 carry out communications from and to the processor 101. The high speed traces 307 can be located at a corner of the processor 101. For example, the high speed traces 307 can be located at the corner 203*c* of the processor 101.

Turning now to FIG. 4, there is shown another example arrangement 400 of the integrated component package shown in FIG. 1. For the purpose of illustrating a clear example, components shown and described with reference to FIG. 1 will be used to describe the arrangement of components shown in FIG. 4. The integrated component package 400 includes the processor 401, HBMs 103*a*, 103*b*, 103*c*, 103*d*, 103*e*, 103*f*, 103*g*, and 103*h*, bump pitch relaxing layers, 105*a*, 105*b*, 105*c*, 105*d*, 105*e*, 105*f*, 105*g*, and 105*h*, decoupling capacitors 405*a*, 405*b*, 405*c*, 405*d*, 405*e*, and 405*f*, and high speed I/O traces 409. HBM 103*a* is coupled to bump pitch relaxing layer 105*a*, HBM 103*b* is coupled to bump pitch relaxing layer 105*b*, HBM 103*c* is coupled to bump pitch relaxing layer 105*c*, HBM 103*d* is coupled to bump pitch relaxing layer 105*d*, HBM 103*e* is coupled to bump pitch relaxing layer 105*e*, HBM 103*f* is coupled to bump pitch relaxing layer 105*f*, HBM 103*g* is coupled to bump pitch relaxing layer 105*g*, and HBM 103*h* is coupled to bump pitch relaxing layer 105*h*. As described above, using bump pitch relaxing layers 105 instead of a large interposer allows for flexible arrangement of components on the integrated component package. In some implementations, the size of the components on the integrated component package can be larger than the size of the components in an integrated component package that utilizes a traditional interposer. For example, as shown in FIG. 4, the size of the die of the processor 401 in the integrated component package 400 can be a large die size. The length of sides 407*a*, and 407*b*, are greater than the length of the sides 407*c*, and 407*d*.

As described above, each of the HBMs 103 is coupled to a bump pitch relaxing layer 105. The HBMs 103 coupled to their respective bump pitch relaxing layers 105 on the integrated component package 400 can be placed along sides of the processor 401 that are longer than the other sides of the processor 401. For example HBM 103*a* coupled to bump pitch relaxing layer 105*a*, 103*c* coupled to bump pitch relaxing layer 105*c*, 103*e* coupled to bump pitch relaxing layer 105*e*, and 103*g* coupled to bump pitch relaxing layer 105*g* are positioned along a side 407*a* of the processor 401 and the HBM 103*b* coupled to bump pitch relaxing layer 105*b*, 103*d* coupled to bump pitch relaxing layer 105*d*, 103*f* coupled to bump pitch relaxing layer 105*f*, and 103*h* coupled to bump pitch relaxing layer 105*h*, are positioned along a side 407*b* of the processor 401. The integrated component package 400 includes the decoupling capacitors 405*a*, 405*b*, 405*c*, 405*d*, 405*e*, and 405*f*, generally referred to herein as decoupling capacitors 405. Similar to the decoupling capacitors 205 and 305, the decoupling capacitors 405 can be configured to provide power to the processor 401 and the HBMs 103.

The decoupling capacitors 405*a*, and 405*f* are arranged along a side 407*c* of the processor 401, the decoupling capacitors 405*b* are arranged along a side 407*a* of the processor 401, the decoupling capacitors 405*c*, and 405*d* are arranged along a side 407*d*, the decoupling capacitors 405*e* are arranged along a side 407*b*. Similar to the integrated component packages shown in FIG. 2 and FIG. 3, the integrated component package 400 includes a high speed I/O trace 409, which can be formed from copper. The high-speed I/O trace 409 can be configured to carry out high-speed I/O communications from and to the processor 401 and can be formed from a metal or metal alloy, such as gold, silver, titanium, tungsten, copper, and the like.

Figure 5A:
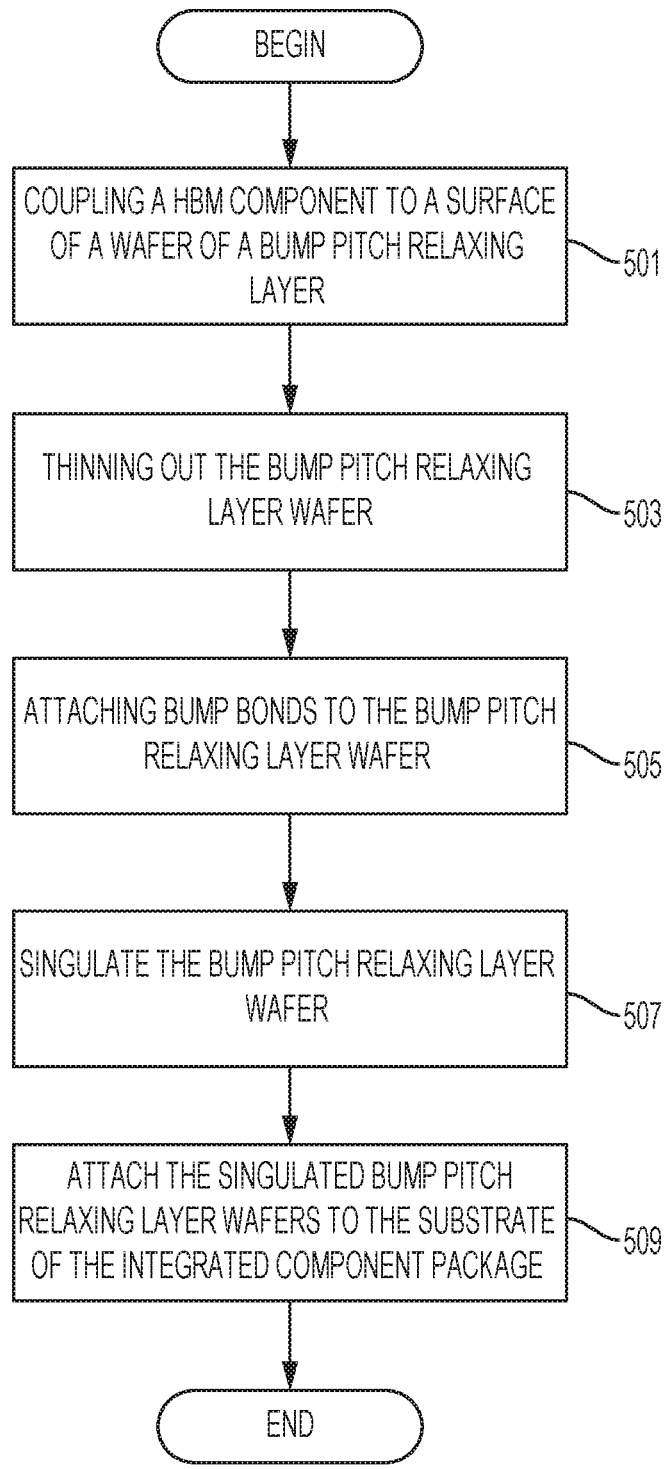
FIG. 5A is a flow diagram of a method for assembling a high bandwidth memory component to a bump pitch relaxing layer according to an example implementation.

Turning now to FIG. 5A, there is shown an example method of fabrication 500, which when executed results in a HBM component being coupled to a bump pitch relaxing layer and the coupled HBM and bump pitch relaxing layer being coupled to a substrate of the integrated component package 100. The method 500 includes coupling a HBM component to a surface of a wafer of a bump pitch relaxing layer, such as bump pitch relaxing layer wafer (stage 501). The method 500 further includes thinning out the bump pitch relaxing layer wafer (stage 503). The method 500 further includes attaching bump bonds to the bump pitch relaxing layer wafer (stage 505). The bump pitch relaxing layer wafer coupled to the HBM component is singulated (stage 507). The singulated bump pitch relaxing layers coupled to the HBM components are attached to the substrate of the integrated component package (stage 509).

The method 500 includes, coupling a HBM component to a surface of a bump pitch relaxing layer, such as a bump pitch relaxing layer wafer (stage 501). For example, HBM 510a, 510b, 510c, 510d, 510e, 510f, generally referred to herein as HBM 510 are coupled to a surface of the bump pitch relaxing layer wafer 511, as shown in FIG. 5B. The bump pitch relaxing layer wafer 511 may include plated through holes. In some implementations, where the bump pitch relaxing layer wafer 511 includes silicon, the plated-thru holes are through-silicon vias. The HBM 510 are coupled to the bump pitch relaxing layer wafer 511 by attaching the bump bonds of the HBM 510 to a surface of the bump pitch relaxing layer wafer 511. For example, HBM 510a is coupled to the bump pitch relaxing layer wafer 511 by attaching bump bonds 512a of the HBM 510a to a surface of the bump pitch relaxing layer wafer 511. Similarly, HBM 510b is coupled to the bump pitch relaxing layer wafer 511 by attaching bump bonds 512b of the HBM 510b to a surface of the bump pitch relaxing layer wafer 511, HBM 510c is coupled to the bump pitch relaxing layer wafer 511 by attaching bump bonds 512c of the HBM 510c to a surface of the bump pitch relaxing layer wafer 511, HBM 510d is coupled to the bump pitch relaxing layer wafer 511 by attaching bump bonds 512d of the HBM 510d to a surface of the bump pitch relaxing layer wafer 511, HBM 510e is coupled to the bump pitch relaxing layer wafer 511 by attaching bump bonds 512e of the HBM 510e to a surface of the bump pitch relaxing layer wafer 511, HBM 510f is coupled to the bump pitch relaxing layer wafer 511 by attaching bump bonds 512f of the HBM 510f to a surface of the bump pitch relaxing layer wafer 511. The bump bonds 512a, 512b, 512c, 512d, 512e, 512f are generally referred to herein as bump bonds 512.

The method 500 includes, thinning out the bump pitch relaxing layer wafer (stage 503), as shown in FIG. 5C. In FIG. 5C, the bump pitch relaxing layer wafer 511 is thinned out. The method 500 includes attaching bump bonds to the bump pitch relaxing layer wafer (stage 505), as shown in FIG. 5C. In FIG. 5C, bump bonds 513 are attached to the bump pitch relaxing layer wafer 511. The bump pitch of the bump bonds 513 attached to the bump pitch relaxing layer wafer 511 can be larger than the bump pitch of the bump bonds 512 attached to the HBM 510. In some implementations, the diameter of each of the bump bonds attached to the bump pitch relaxing layer wafer 511 may be larger than the diameter of each of the bump bonds attached to the HBM 510. For example, the diameter of a bump bond attached to the bump pitch relaxing layer wafer may be greater than or equal to 80 micrometers, while the diameter of a bump bond attached to the HBM 510 is 55 micrometers. The method 500 includes singulating the bump pitch relaxing layer wafer (stage 507), as shown in FIG. 5D. In FIG. 5D, the bump pitch relaxing layer wafer 511 is singulated into bump pitch relaxing layers 511a, 511b, 511c, 511d, 511e, and 511f. Each singulated bump pitch relaxing layer is attached with corresponding bump bonds among the bump bonds 513. For example, the bump pitch relaxing layer 511a is attached with bump bonds 513a, the bump pitch relaxing layer 511b is attached with bump bonds 513b, the bump pitch relaxing layer 511c is attached with bump bonds 513c, the bump pitch relaxing layer 511d is attached with bump bonds 513d, the bump pitch relaxing layer 511e is attached with bump bonds 513e, and the bump pitch relaxing layer 511f is attached with bump bonds 513f. The method 500 includes attaching the singulated bump pitch relaxing layers to the substrate of an integrated component package, such as the integrated component package 100 (stage 509). Attaching the singulated bump pitch relaxing layers to the substrate of the integrated component package 100 includes electrically connecting the singulated bump pitch relaxing layers to the substrate of the integrated component package 100. Attaching the singulated bump pitch relaxing layers to the substrate of the integrated component package 100 includes mechanically connecting the singulated bump pitch relaxing layers to the substrate of the integrated component package 100. By attaching the singulated bump pitch relaxing layers to the substrate of an integrated component package, such as the integrated component package 100, the HBM coupled to the singulated bump pitch relaxing layer, such as the HBM 103a coupled to the bump pitch relaxing layer 511a, is electrically connected to the substrate of the integrated component package.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. An integrated component package comprising:
   a substrate;
   a bump pitch relaxing layer;
   a high-bandwidth memory component directly mechanically coupled to the bump pitch relaxing layer on a first side of the bump pitch relaxing layer via a first set of bump bond connections, wherein:
      the high-bandwidth memory component is directly electrically coupled to the bump pitch relaxing layer on the first side of the bump pitch relaxing layer via the first set of bump bond connections,
      the bump pitch relaxing layer is mechanically coupled to a first side of the substrate via a second set of bump bond connections, and
      the high-bandwidth memory component is electrically coupled to the substrate via the bump-pitch relaxing layer and the second set of bump bond connections, wherein a bump pitch of the bump bond connections in the second set of bump bond connections is larger than a bump pitch of the bump bond connections in the first set of bump bond connections;
   a processor directly coupled to the substrate via a third set of bump bond connections; and
   one or more high-speed input/output (I/O) traces coupled to the bump pitch relaxing layer and the third set of bump bond connections, wherein the high-bandwidth memory component is electrically coupled to the processor via the bump pitch relaxing layer.

2. The integrated component package of claim 1, wherein the first set of bump bond connections are packed more densely than the second set of bump bond connections.

3. The integrated component package of claim 1, further comprising:
   a redistribution layer included in the bump pitch relaxing layer; and
   a dielectric layer included on top of the redistribution layer.

4. The integrated component package of claim 3, wherein the bump pitch relaxing layer includes plated thru-holes that correspond to the second set of bump bond connections.

5. The integrated component package of claim 4, wherein the redistribution layer includes one or more traces that terminate at one end of the plated thru-holes and at the other end are exposed to openings that correspond to the first set of bump bond connections.

6. The integrated component package of claim 1, wherein a bump pitch of the third set of bump bond connections is larger than a bump pitch of the first set of bump bond connections.

7. The integrated component package of claim 1, further comprising:
   a decoupling on-package capacitor connected to a top side of the substrate.

8. The integrated component package of claim 1, wherein the processor is an application specific integrated circuit.

9. The integrated component package of claim 1, wherein the substrate is an organic substrate.

10. The integrated component package of claim 1, wherein the bump pitch relaxing layer comprises silicon.

* * * * *